(12) United States Patent
Lovett et al.

(10) Patent No.: US 6,591,370 B1
(45) Date of Patent: Jul. 8, 2003

(54) MULTINODE COMPUTER SYSTEM WITH DISTRIBUTED CLOCK SYNCHRONIZATION SYSTEM

(75) Inventors: Thomas D. Lovett, Portland, OR (US); Bruce M. Gilbert, Beaverton, OR (US); Thomas B. Berg, Portland, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/471,939

(22) Filed: Dec. 23, 1999

(51) Int. Cl.[7] .............................. G06F 1/04; G06F 1/12; H03L 7/00
(52) U.S. Cl. ...................... 713/502; 713/500; 327/151; 327/153
(58) Field of Search ................................ 713/500, 502; 327/153, 151

(56) References Cited

U.S. PATENT DOCUMENTS

| | | | |
|---|---|---|---|
| 5,528,558 A | * 6/1996 | Mardhekar et al. | 368/10 |
| 5,748,923 A | * 5/1998 | Eitrich | 710/305 |
| 5,802,354 A | 9/1998 | Kubala et al. | 395/551 |
| 5,802,578 A | 9/1998 | Lovett | 711/147 |
| 5,850,157 A | * 12/1998 | Zhu et al. | 327/165 |
| 5,974,236 A | * 10/1999 | Sherman | 340/825.02 |

* cited by examiner

*Primary Examiner*—Thomas Lee
*Assistant Examiner*—Mark Connolly
(74) *Attorney, Agent, or Firm*—Klarquist Sparkman LLP

(57) ABSTRACT

A multinode multiprocessor computer system with distributed local clocks wherein a local clock may be synchronized with other clocks in the system without affecting the operation of the other clocks. A local clock to be synchronized is reset and counts an elapsed time since the reset. Simultaneously with resetting the local clock, a clock value from a clock on a source node is stored. The clock value from the source node is copied to the node to be synchronized and added to the elapsed time. The resulting summation is then stored in the local clock to be synchronized. As a result, the local clock is synchronized to the clock on the source node. In one system embodiment, the local clock includes a dynamic register and a base register and an adder adds the two portions together to generate an output of the local clock. For a node being synchronized, the dynamic portion is reset and allowed to count the elapsed time while the base portion is loaded with a clock value copied from the source node. In another system embodiment, a clock register stores both dynamic and base portions. For a node being synchronized, the clock register is reset and allowed to count the elapsed time. The base portion from the source node is then added to the clock register and stored in the clock register.

33 Claims, 7 Drawing Sheets

FIG. 4
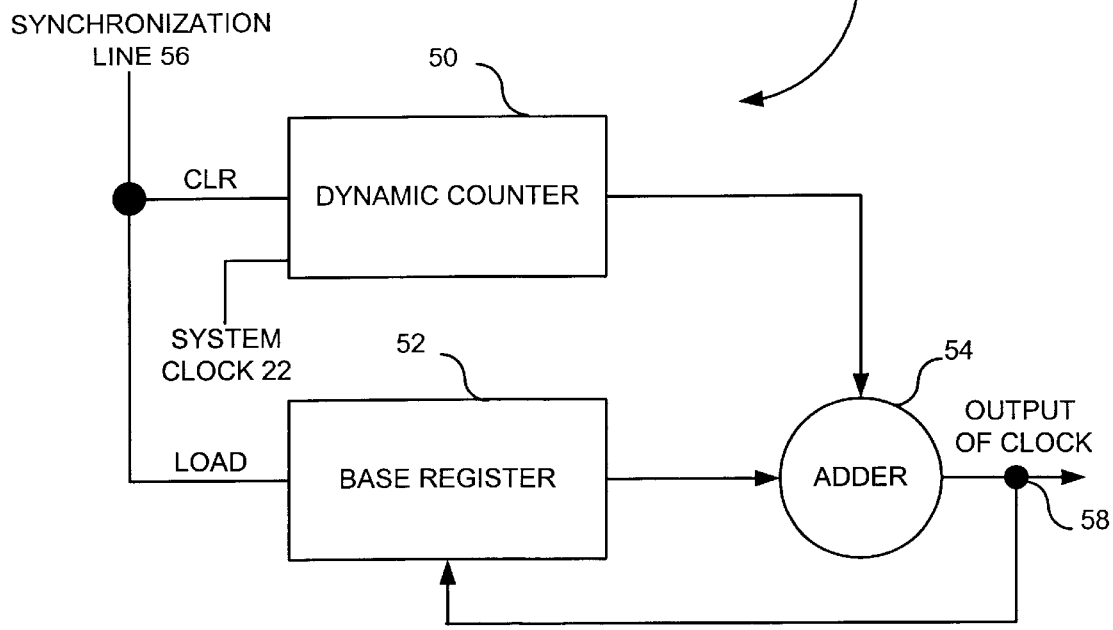
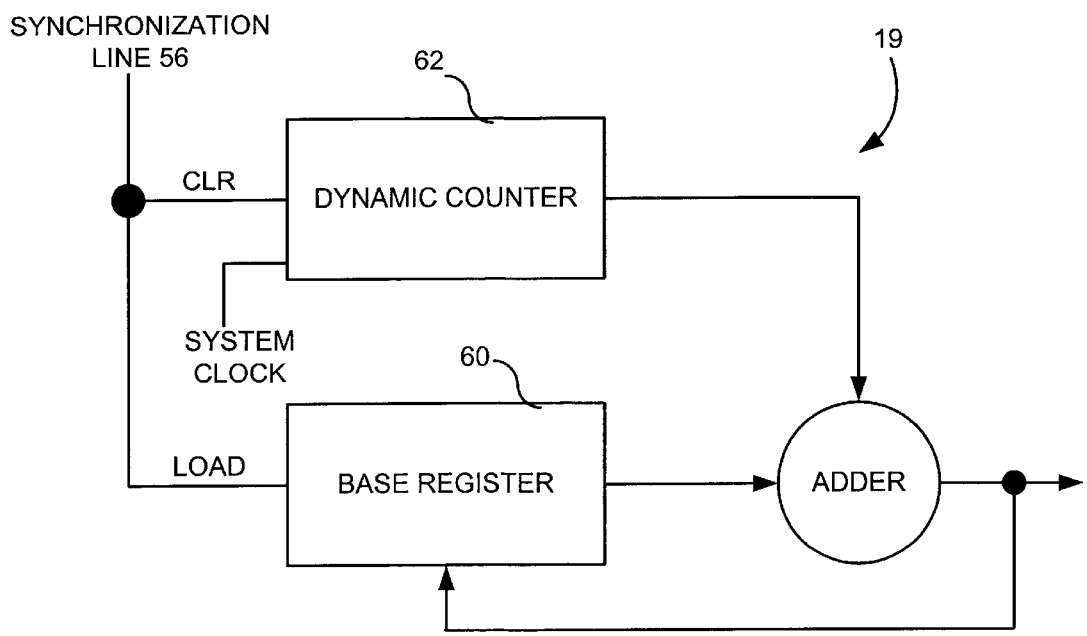

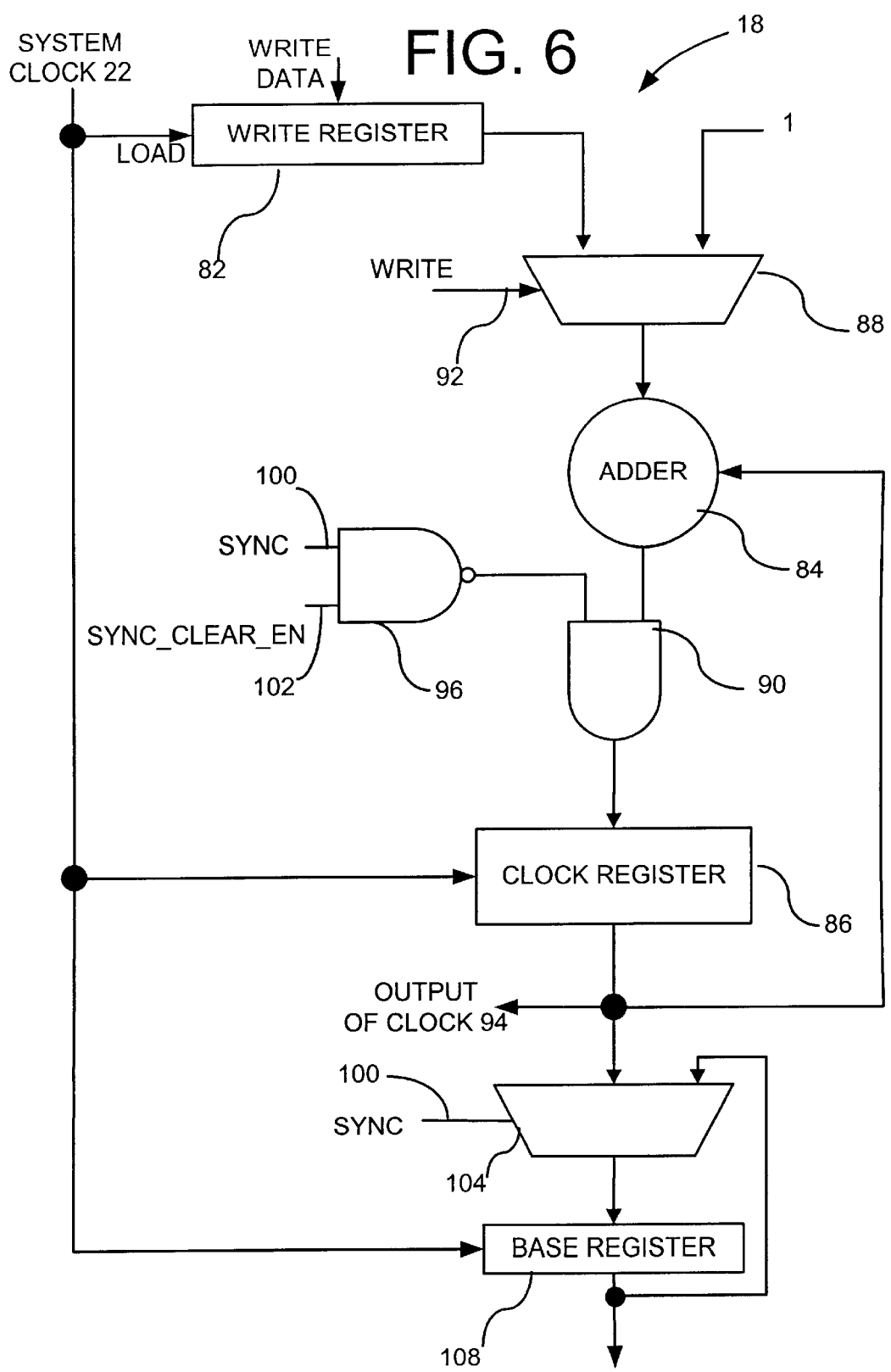

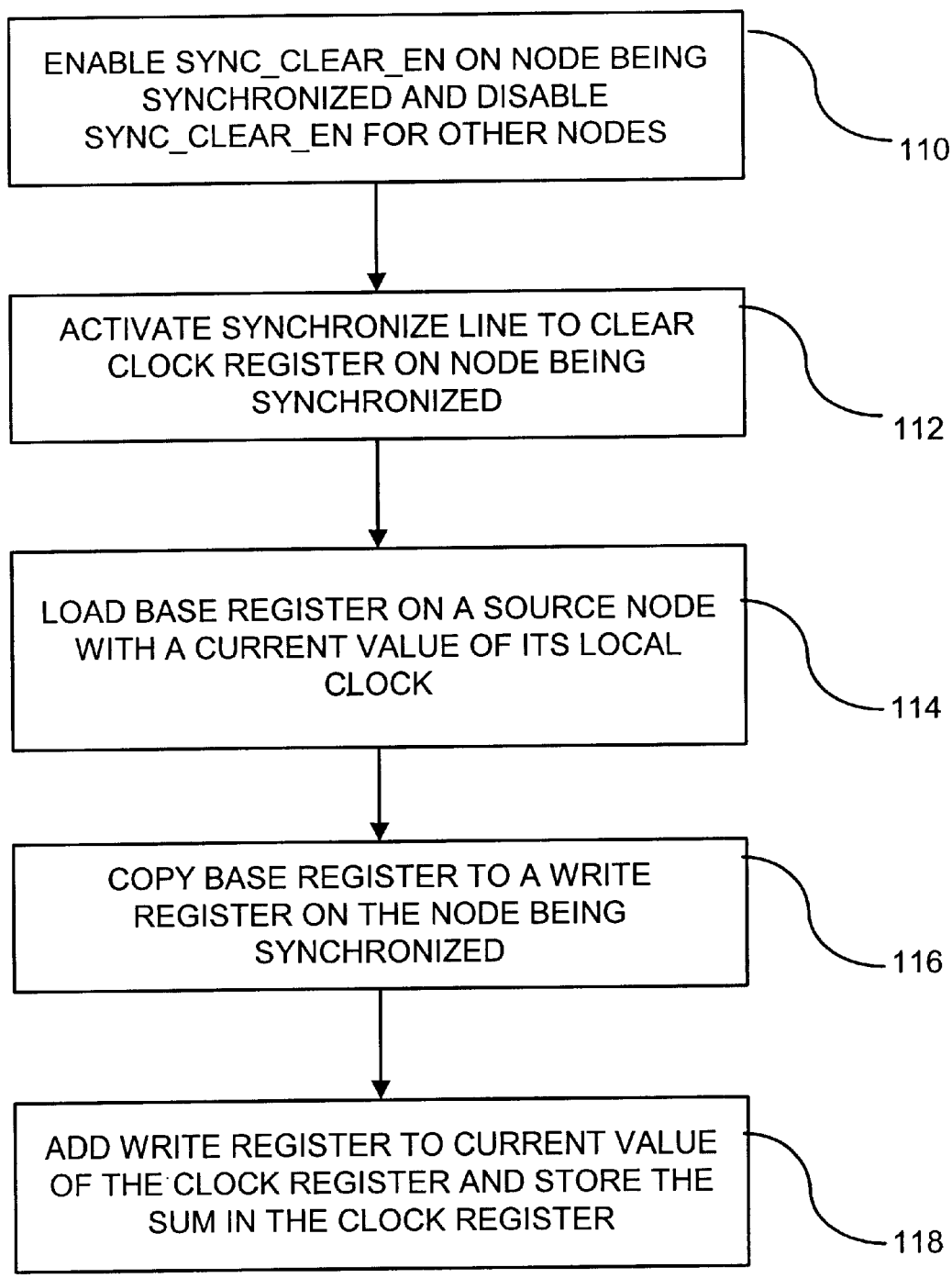

MULTINODE COMPUTER SYSTEM WITH DISTRIBUTED CLOCK SYNCHRONIZATION SYSTEM

TECHNICAL FIELD

The present invention relates generally to multiprocessor computer systems and, more particularly, to a multinode multiprocessor system with distributed local clocks.

BACKGROUND

Multinode multiprocessor computer systems typically have multiple processors in each node. The nodes are connected together through a system interconnect to facilitate communication between the processors. In some applications, the nodes may be divided into physical partitions, or domains, wherein each physical partition is capable of operating as a separate computer. Typically, the processors on the nodes need access to a system clock to determine the time that events start, stop, timeout, etc. For example, as part of a TCP/IP protocol, processors must measure a roundtrip time for TCP/IP packets to travel between source and destination computers. Another example is the running of a debugging application that places timestamps on events and stores the timestamps in a log file. In such debugging applications, the exact time and sequence of events is important. Because different processors on different nodes store timestamps in the log file, it is important that all the processors have access to a common time base. If the processors access different clocks and those clocks are not synchronized, the timestamps would be meaningless and events would appear erroneously out of order.

The simplest mechanism for providing a common time base in a multinode system is a single system clock accessible by all processors. However, the latency to access such a clock is high and unpredictable. As a result, the clock value read by a processor may be inaccurate. Some applications have provided a local clock on each node that is accessible to each processor or set of processors and that can be read with low and predictable latency. Of course, for such a system to properly operate, all of the local clocks must be synchronized. One synchronization technique is to have all the local clocks operate from a single oscillator source. To synchronize the clocks, they are reset together. The clocks then remain in lock step with each other because they operate from the single oscillator source.

In a multinode computer system, it is often desirable to dynamically add a node or modify a partition after the local clocks are reset. Such a change allows the system to dynamically modify processor resources to maximize processor efficiency. However, after a node is dynamically added or a partition modified, it is not acceptable to reset the local clocks in nodes that are already running. For example, a node may be executing a TCP/IP transfer, and resetting the local clock would result in an inaccurate time measurement for packet transfer.

An objective of the invention, therefore, is to provide a distributed clock synchronization system wherein a local clock can be synchronized without affecting the operation of running clocks on other nodes.

SUMMARY

The present invention provides a multinode computer system with distributed local clocks wherein a local clock may be synchronized with other clocks in the system. The synchronization may occur while nodes are fully operational without resetting, stopping, or affecting the local clocks on the fully operational nodes. This synchronization allows for dynamic partitioning wherein processor resources may be modified during operation of the computer system. For example, a node may be added to the system while the system is running and a local clock on the added node may be synchronized to other clocks in the system without affecting the operation of the other clocks.

In one aspect, a local clock to be synchronized is reset and counts an elapsed time since the reset. Substantially simultaneously with resetting the local clock, a clock value is stored from a clock on a source node, which can be any other node in the system. The clock value read from the source node is copied to the node to be synchronized and added to the elapsed time. The resulting summation is then stored in the local clock so that the local clock is synchronized to the clock on the source node.

In another aspect, a local clock includes a dynamic portion and a base portion and an adder adds the two portions together to generate an output of the local clock. For a node being synchronized, the dynamic portion is reset and counts an elapsed time while the base portion is loaded with a clock value copied from the source node.

In yet another aspect, a clock register stores both dynamic and base portions. For a node being synchronized, the clock register is reset and allowed to count an elapsed time. A clock value from a source node is then added to the clock register and the resulting summation is stored in the clock register.

The foregoing and other objects, features, and advantages of the invention will become more apparent from the following detailed description that proceeds with reference to the following drawings.

DESCRIPTION OF THE DRAWINGS

FIG. 4 is a block diagram of one embodiment of a local clock in accordance with the invention.

FIG. 6 is a diagram of another embodiment of a local clock in accordance with the invention.

FIG. 7 is a flow chart of a method for synchronizing the local clock of FIG. 6.

DETAILED DESCRIPTION

Figure 1:
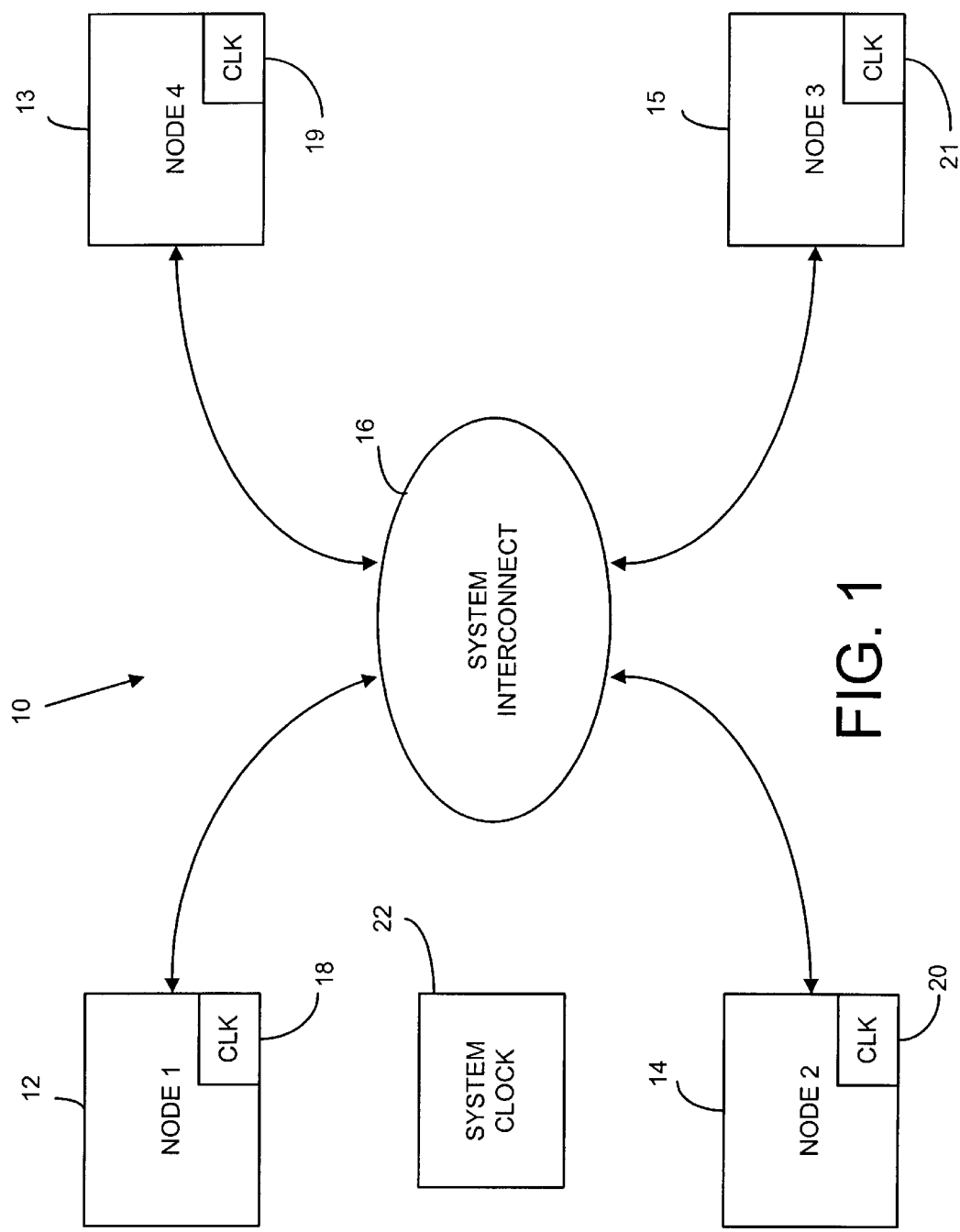
FIG. 1 is a block diagram of a multinode multiprocessor computer system with distribute local clocks on the nodes in accordance with the invention.

FIG. 1 is a block diagram of a multinode, multiprocessor computer system 10 with distributed local clocks in accordance with the invention. Four nodes 12–15 are shown connected by a system interconnect 16 (i.e., a network) that permits any node to communicate with any other node. The nodes 12–15 are shown having local clocks 18–21. The local clocks are controlled by a central system oscillator 22, which allows the local clocks to stay in lock step with each other after being synchronized, as further described below. The local clocks 18–21 allow processors on the nodes 12–15 to read their respective local clock with low and predictable latency. Although each node is shown with only one local clock, some nodes may contain more than one local clock. Additionally, some nodes may not have a local clock.

As described further below, the multinode computer system 10 allows one or more local clocks 18–21 to be synchronized while the system is operational and without affecting the operation of other clocks running on the system. The synchronization techniques described below can apply to any multinode computer system with distributed local clocks. For example, the system 10 may be a Distributed-Shared Memory (DSM) architecture wherein each node can access memory on other nodes. In such a case, the system interconnect 16 allows processors on any node to access the memory resident on any other node with cache coherency guaranteed and provides processors access to system resources on other nodes. The system interconnect 16 may be a switch-based network that uses the Scalable Coherent Interface (SCI) interconnection mechanism. SCI is an IEEE-approved standard, or protocol (1596), well documented in a number of publications including IEEE Std 1596–1992 (Aug. 2, 1993) and *Multiprocessor Interconnection Using SCI*, a Master Thesis by Ivan Tving, DTH ID-E 579 (1994). System interconnect 16 may also be a switch-based network that uses a crossbar switch to allow nodes to access memory on other nodes. Other system interconnect architectures also may readily be used, as is well understood in the art.

The physical links of interconnect 16 provide high bandwidth and low latency and are scalable to allow for the addition of more nodes. Examples of links that meet these requirements include point-to-point interconnects with a data throughput of one gigabyte/second or greater. The links can be configured in any number of suitable ways for connecting nodes 12–15, such as in a ring topology, in arbitrary topologies through switches, or in a combination of both. The links can be wired or wireless (optical, RF, etc.) depending upon system performance needs. Additional topologies are described in "Interconnect Topologies with Point-To-Point Rings," Ross E. Johnson and James E. Goodman, December 1991, *Computer Sciences Technical Report*#1058, University of Wisconsin—Madison.

Figure 2:
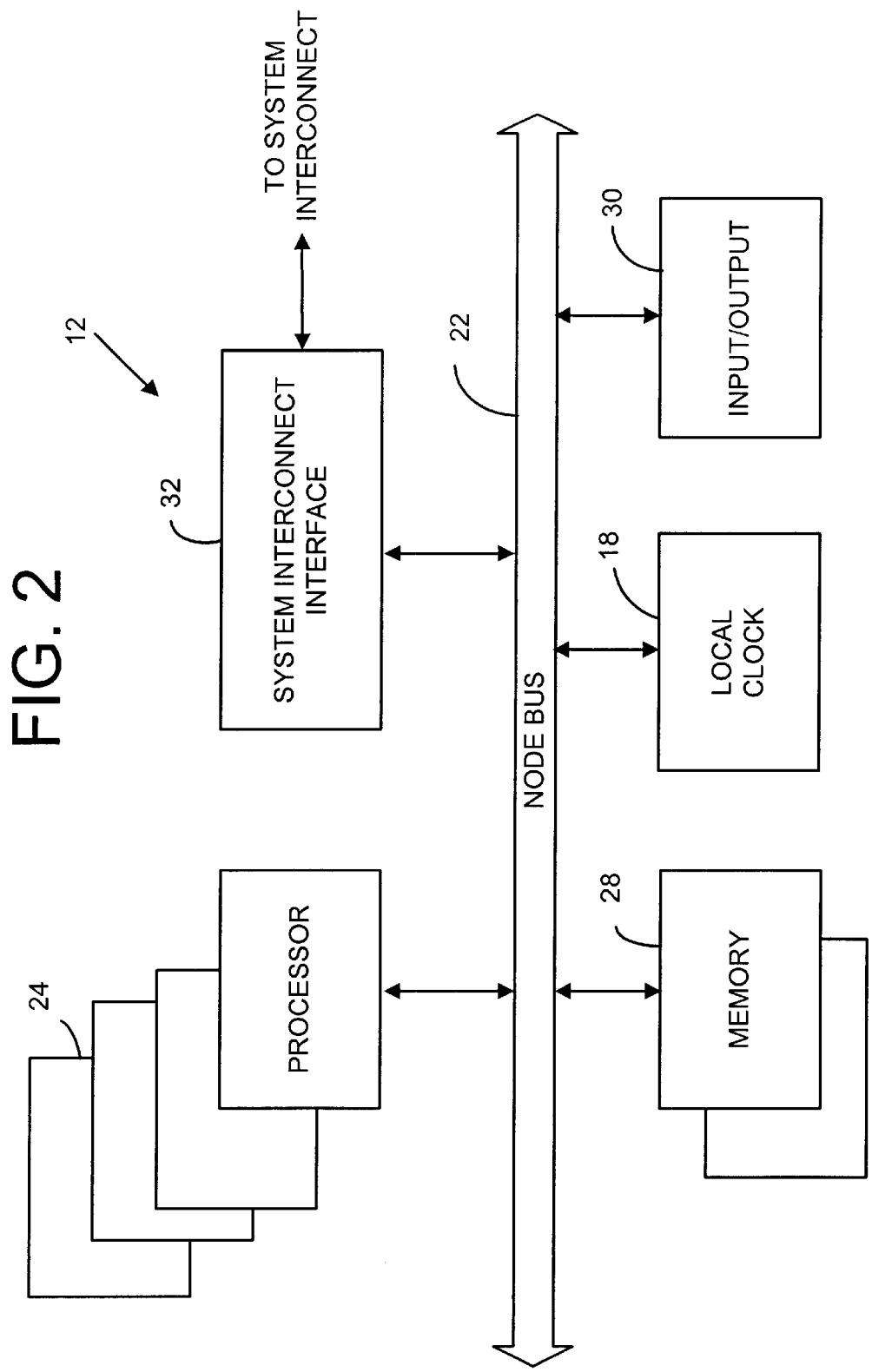
FIG. 2 is a block diagram of one of the nodes of the computer system of FIG. 1.

A variety of architectures may be used for the nodes. FIG. 2 is a block diagram of one example of node 12. The other nodes 13–15 have a similar architecture in this embodiment and will not be described further. Node 12 includes one or more processors 24 and the local clock 18. Any desired processor may be used in the system, such as Pentium® Pro or Itanium™ processors sold by Intel Corporation. A conventional node bus 22 (e.g., a symmetrical multiprocessor bus, such as a Pentium Pro bus) connects multiple data processors 24 to a local memory 28 and local clock 18. The node may also include an input/output (I/O) 30 that connects the node to devices outside computer system 10 for communicating information between the computer system and the outside world. The I/O may be of conventional design and includes means for connecting the node (and hence system 10) to personal computers, local area networks, etc., that wish to utilize the power of the multinode computer system. To connect node 12 to the other nodes in the system, the node includes a system interconnect interface 32. The system interconnect interface 32 forms part of interconnect 16 along with the physical links between nodes and the same devices on the other nodes of the computer system 10.

Figure 3:
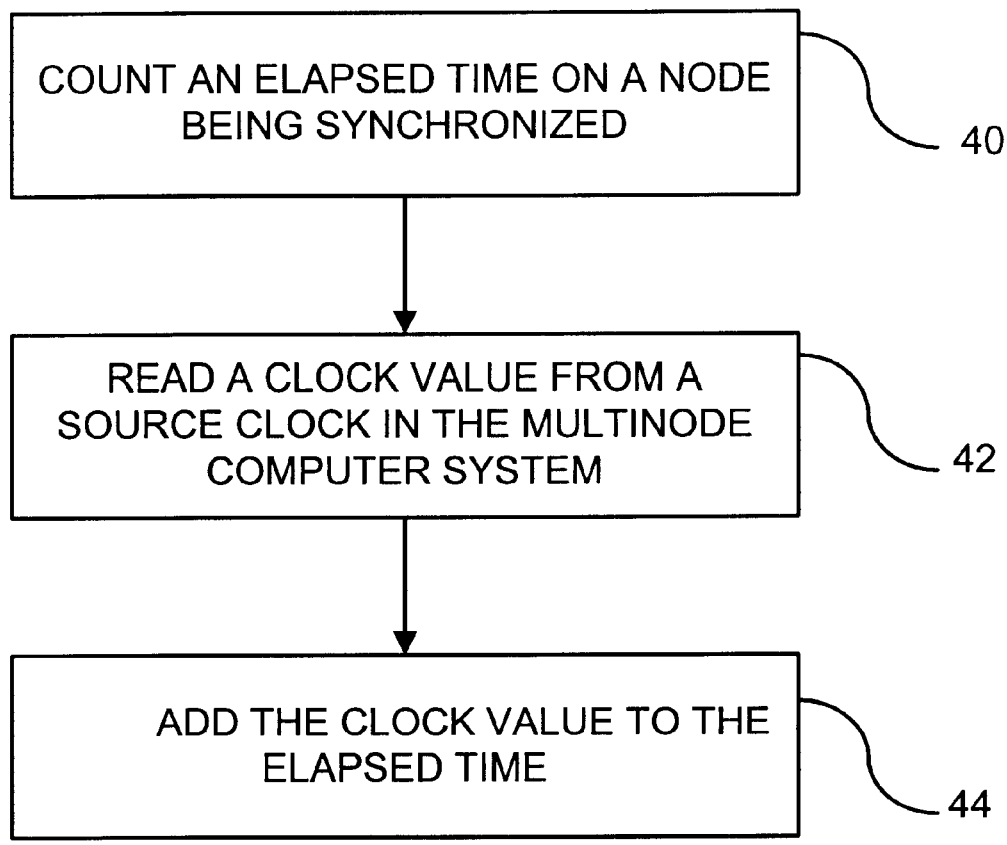
FIG. 3 shows a flow chart of a method for synchronizing a local clock on a node to other clock in the multinode multiprocessor computer system.

FIG. 3 is a flow chart of a method for synchronizing local clock 18 on multinode computer system 10. The synchronization method allows a local clock to be initialized to the value of a source clock without affecting the operation of the source clock. This is particularly advantageous in systems that allow dynamic partitioning wherein processor resources may be added to a partition after the partition is reset. For purposes of illustration, local clock 18 on node 12 is described below as being synchronized to local clock 19 on node 13. In process block 40, local clock 18 to be synchronized maintains a count of an elapsed time since last receiving a synchronizing signal, as described further below. In process block 42, a clock value is read from source clock 19 at substantially the same time as the elapsed time begins to count. Source clock 19 is preferably running and synchronized to other local clocks in the multinode system 10. While the clock value is read, source clock 19 continues to run without interruption and maintains its synchronization to the other clocks in the system. In process block 44, the clock value read from source clock 19 is added to the count of elapsed time. In at least one embodiment, this sum is then stored in local clock 18, thereby synchronizing clock 18 with clock 19.

FIG. 4 is a block diagram of hardware that can be used as the local clocks 18, 19. Local clock 18 includes a dynamic counter 50, a base register 52, and an adder 54. The dynamic counter 50 is coupled to system clock 22 and increments on every cycle of the system clock. Alternatively, dynamic counter 50 may include a prescaler so that it increments only after a certain number of cycles of system clock 22. Dynamic counter 50 is also attached to a synchronization line 56 such that when the synchronization line is active the dynamic counter is cleared. Dynamic counter 50 stores a dynamic portion of a time value for local clock 18. A base or static portion of the time for the local clock is stored in base register 52. Adder 54 calculates a sum of dynamic counter 50 and base register 52 and produces the time value of local clock 18 on output 58 of the adder. Output 58 of adder 54 is also coupled to base register 52. Base register 52 loads the value of the adder in response to activation of synchronization line 56. Although not shown, base register 52 is also writable and readable through software and hardware. Thus, any desired value may be written to base register 52. FIG. 4 also shows local clock 19 as having a similar structure as local clock 18. Thus, local clock 19 also includes a base register 60 and a dynamic counter 62.

Figure 5:
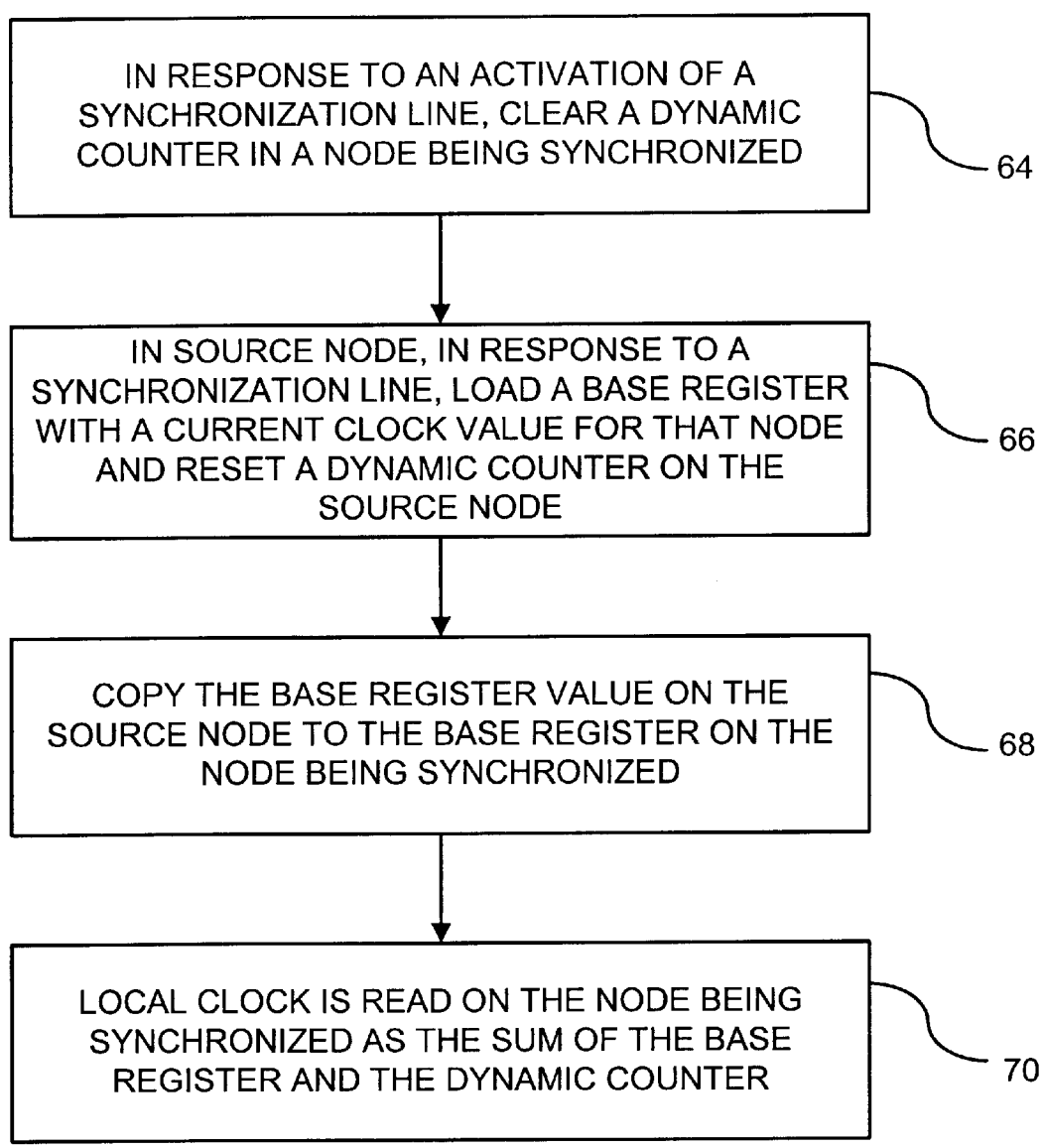
FIG. 5 is a flow chart of a method for synchronizing the local clock of FIG. 4.

FIG. 5 is a flow chart of a method for synchronizing local clock 18 of FIG. 4. In process block 64, dynamic counter 50 is cleared in response to activation of synchronization line 56. Specifically, a short pulse is supplied on synchronization line 56 to clear dynamic counter 50. Dynamic counter 50 may be cleared on a rising or falling edge of the synchronization signal or may be level triggered. After dynamic counter 50 is cleared, it continues to increment in response to system clock 22. Consequently, counter 50 stores an elapsed time since activation of the synchronization line. In process block 66, local clock 19 is used as a source clock. In response to activation of the synchronization line 56, base register 60 is loaded with the output of the adder at substantially the same time that dynamic counter 62 is cleared. Thus, the base register stores a static clock value. Notably, the output of local clock 19 remains unchanged and continues to increment. Additionally, dynamic counters 50 and 62 contain the same values since they both are cleared at the same time by synchronization line 56.

In process block 68, base register 60 from local clock 19 is copied to base register 52 of local clock 18. During the read and write operation of process block 68, dynamic counters 50 and 62 have been incrementing and contain an elapsed time since synchronization line 56 was activated (i.e., depending on whether dynamic counter 50 is edge or level triggered, the dynamic counter 50 may store an elapsed time from the activation of the synchronization line 56 or an elapsed time since the synchronization line 56 is deactivated.) Once base register 52 is loaded with the clock value from base register 60, the local clock 18 is synchronized. In process block 70, the synchronized clock is obtained by adding the counts in dynamic counter 50 and base register 52 and providing their sum as the synchronized clock on output 58 of adder 54. Although the above-described example uses a predetermined local clock on node 13, any local clock in the system may be used. Alternatively, this system may include a central clock (not shown) similar to local clock 18 that is used to synchronize any local clocks on the nodes.

FIG. 6 shows another embodiment of a local clock 18 that may be used. In FIG. 6, local clock 18 includes a write register 82, an adder 84, and a clock register 86 (also called a dynamic register). Unlike the dynamic counters of FIG. 4, clock register 86 of FIG. 6 contains the total clock value of clock 18. Clock register 86 may be any desired size, such as 64 bits. In its normal mode of operation, clock register 86 increments once per cycle of the system clock 22 (however, a prescaler may be used). This incrementing of clock register 86 is effectuated by using a multiplexer 88, adder 84, and an AND gate 90. Multiplexer 88 is a 2:1 multiplexer having one input coupled to write register 82 and another input coupled to a constant (e.g., a logical 1). Multiplexer 88 outputs a 1 unless a write line 92 is activated. Adder 84 adds the logical 1 to the current value of clock register 86 and outputs to AND gate 90 this incremented value. During its normal mode of operation, the AND gate 90 passes this incremented value to clock register 86, which loads the value in synchronization with system clock 22. Thus, an output 94 of the clock 18 is the value of the local clock, which increments in synchronization with the system clock. If write line 92 is activated, multiplexer 88 passes the contents of write register 82 to adder 84 rather than a logical 1. Adder 84 then adds write register 82 to clock register 86 and the result is stored in clock register 86.

A NAND gate is also coupled to the AND gate 90 and includes a sync input 100 and a sync_clear_en input 102. When enabled, the sync_clear_en input clears clock register 86 if sync input 100 is activated. If either sync line 100 or sync_clear_en line 102 is deactivated or disabled, then clock register 86 loads the output of adder 84.

Coupled to the clock output 94 is a 2:1 multiplexer 104 whose control line is coupled to sync line 100. Multiplexer 104 has one of its inputs coupled to the output of clock register 86 and the other input coupled to an output of a base register 108. In its normal mode of operation, sync line 100 is deactivated and multiplexer 104 feeds the output of the base register 108 back in to the base register. Thus, the base register reloads its own contents on every system clock. If sync line 100 is activated, multiplexer 104 feeds the contents of clock register 86 into base register 108. Although not shown, base register 108 is readable by software and hardware.

FIG. 7 shows a flow chart of a method for synchronizing local clock 18 of FIG. 6. In process block 110, sync_clear_en line 102 on the node being synchronized is enabled and for all other nodes not being synchronized the sync_clear_en line is disabled. In process block 112, sync line 100 is activated. In the local clock of the node being synchronized, with the sync line activated and sync_clear_en line enabled, NAND gate 96 outputs a logic low to AND gate 90. As a result, AND gate 90 outputs a zero to clock register 86, which clears the clock register. In a source node where sync_clear_en is disabled, clock register 86 loads the contents of adder 84 and continues to increment.

In process block 114, base register 108 on all the nodes in the system is loaded with the output 94 of clock register 86 as a result of the sync line 100 being activated and causing multiplexer 104 to pass output 94 to base register 108. Thus, base register 108 contains the value of the local clock at the time of the activation of the sync signal. Those skilled in the art will recognize that clock register 86 and base register 108 may load contents on a rising or falling edge and may be edge-triggered or level triggered. Process blocks 112 and 114 occur substantially simultaneously since clearing clock register 86 and loading base register 108 are both responsive to sync line 100.

In process block 116, base register 108 from the source node is copied to the write register 82 on the node being synchronized. Before copying base register 104, sync line 100 is deactivated and clock register 86 returns to its normal mode of incrementing. Thus on the node being synchronized, clock register 86 maintains an elapsed time that occurs after the sync signal is activated. The write line 92 is then enabled, causing the multiplexer 88 to pass the contents of the write register 82 to adder 84. Adder 84 adds the elapsed time from clock register 86 and the content of write register 82, and passes this sum to the AND gate 90 (process block 118). Consequently, the clock register 86 loads its own elapsed time plus the base register from the source node synchronizing the clock register with the source node clock register. It should also be noted that the clock registers on other nodes (including the source node) are not affected by this process.

The different embodiments of the invention can be used to synchronize local clocks when processor resources are modified during the operation of the system 10. Thus, in a dynamically partitionable system where a node is added, the new node can be synchronized with other nodes in the system without stopping or affecting clocks on nodes already synchronized.

Having illustrated and described the principles of the illustrated embodiments, it should be apparent to those skilled in the art that the embodiments can be modified in arrangement and detail without departing from such principles. Although the embodiments are described in terms of particular hardware and software used, the hardware can be replaced by software and vice versa. Furthermore, although the invention is described with a central system clock, the clock synchronization can be accomplished without such a clock with the addition of logic to adjust for the drift of the different oscillators. In such a case, separate oscillators can be used to synchronize the local clocks. Additionally, although specific embodiments of local clocks are used, a variety of circuits can be used to implement the local clock. Still further, although four nodes are shown, the invention can be applied to any number of nodes.

In view of the many possible embodiments, it should be recognized that the illustrated embodiments include only preferred examples of the invention and should not be taken as a limitation on the scope of the invention. Rather, the invention is defined by the following claims. We therefore claim as the invention all such embodiments that come within the scope of these claims.

We claim:

1. In a multinode multiprocessor computer system having distributed associated local clocks on the nodes, a method of synchronizing the associated local clocks on at least two of the nodes, comprising:

in response to a synchronization signal asserted on a system-wide synchronization line, counting a respective elapsed time on each of the nodes to be synchronized;

storing a clock value from a first node, the clock value representing a current time of a local clock on the first node; and adding the clock value from the first node to the respective elapsed time counted on the each of the nodes to be synchronized individually, thereby obtaining a local clock value for the associated local clock on the each of the nodes to be synchronized.

2. The method of claim 1, wherein the local clock on the second node is continuously running during synchronization of the local clock of the first node.

3. The method of claim 1, further including providing a base register on the first node and storing the clock value from the second node in the base register.

4. The method of claim 3, further including providing a dynamic register on the first node, wherein the elapsed time is stored in the dynamic register, and the local clock value for the first node is obtained by adding the clock value in the base register to the elapsed time in the dynamic register.

5. The method of claim 1, further including storing the synchronized local clock value in a register in the first node.

6. The method of claim 1, further including controlling the counting of the elapsed time on the first node with a system clock to which the first node is coupled without any intermediating nodes.

7. The method of claim 1, wherein storing the clock value from the second node occurs in response to a change in the synchronization signal.

8. The method of claim 1, wherein the elapsed time starts from the activation or deactivation of the synchronization signal.

9. The method of claim 1, further including providing a counter that is cleared in response to the synchronization signal, the counter for counting the elapsed time.

10. The method of claim 1, wherein the storing of the clock value and a start of the counting of the elapsed time occur substantially simultaneously.

11. The method of claim 1, wherein each node includes at least a processor and a local clock.

12. In a multinode computer system having distributed local clocks on the nodes, a method of synchronizing an associated local clock on at least two of the nodes, comprising:

counting an elapsed time on each of the nodes having a local clock to be synchronized after receiving a signal on a system-wide synchronize line, the elapsed time stored in a dynamic register of the node;

reading a clock value from a clock of a first node in the multinode computer system that is not located on the at least two nodes to be synchronized, the clock value stored in a base register of the first node; and adding the clock value from the clock to the elapsed time counted on each of the nodes to be synchronized respectively using an adder, to directly obtain a synchronized local clock value for each one of the at least two nodes to be synchronized.

13. The method of claim 12 further including providing a synchronization line coupled to the node and activating the synchronization line for starting the counting of the elapsed time.

14. The method of claim 12, further including providing the dynamic register coupled to a system clock and clearing the dynamic register in response to the activation of the synchronization line.

15. The method of claim 13, wherein the clock value read is from a local clock on a second node and further including providing a base register on the second node coupled to the synchronization line, the base register loading the clock value of the second node in response to activation of the synchronization line.

16. The method of claim 12 further including providing a system clock coupled to the local clocks on the nodes that increments the local clocks.

17. The method of claim 12, further including providing the dynamic register coupled to a system clock and wherein counting includes incrementing the dynamic register in response to the system clock.

18. The method of claim 12 including storing the added clock value in a single register that is the local clock and that provides the synchronized local clock value.

19. In a multinode computer system, a method of synchronizing a local clock on a node to other nodes in the system, comprising:

providing a local clock for each node in the multinode computer system, wherein the local clocks are running and synchronized with each other;

dynamically adding a node to the multinode computer system, wherein the dynamically added node includes a local clock that is not synchronized to the other local clocks in the multinode computer system;

reading a local clock value from a local clock on one of the nodes in the system other than the dynamically added node;

resetting a local clock on the dynamically added node and running the local clock after it is reset; and adding the read clock value to a value in the local clock of the dynamically added node to synchronize the local clock on the dynamically added node.

20. The multinode computer system of claim 19, wherein the local clock on the dynamically added node has a dynamic portion and a base portion.

21. The multinode computer system of claim 19, wherein reading the local clock is accomplished without affecting the local clock.

22. The multinode computer system of claim 19, further including activating a synchronize line that simultaneously causes the reading and the resetting.

23. The multinode computer system of claim 19, further including:

enabling a clear signal to the dynamically added node to clear its local clock; and disabling a clear signal to all nodes other than the dynamically added node so that the local clocks are not cleared on the other nodes.

24. The multinode computer system of claim 19, wherein the local clock includes a base portion and a dynamic portion and further including activating a synchronize signal that adds the base portion to the dynamic portion and storing the added value in the base register.

25. A clock synchronization system, comprising:

multiple nodes, each with an associated local clock on the node, wherein at least two of the local clocks are to be synchronized with another one of the local clocks from one of the nodes;

each associated local clock including:

(a) a system-wide synchronize line that is activated to synchronize more than one of the associated local clocks to a local clock on another node;

(b) at least one clock register coupled to the synchronize line, the clock register storing an elapsed time that occurs since activation of the synchronize line for the associated local clock being synchronized; and, (c) an adder coupled to the at least one clock register, the adder adding contents of the at least one clock register with contents of at least one clock register on the one of the nodes to directly yield a value of the local clock.

26. The clock synchronization system of claim 25, further including a base register coupled to the clock register and the synchronization line that stores a current value of the clock register when the synchronization line is activated.

27. The clock synchronization system of claim 25, wherein a local clock includes a dynamic portion and a base portion and the clock register stores only the dynamic portion.

28. The clock synchronization system of claim 25, wherein a local clock includes a dynamic portion and a base portion.

29. The clock synchronization system of claim 25, further including a base register coupled to the clock register for storing a time value of the local clock in response to activation of the synchronize line.

30. The clock synchronization system of claim 29, wherein the base register stores a static portion of the time value of the local clock and in response to the activation of the synchronize line the base register stores the sum of the base register plus the clock register.

31. The clock synchronization system of claim 29, wherein in response to the activation of the synchronize line the value of the local clock is copied to the base register.

32. The clock synchronization system of claim 25 further including a global clock that the local clocks are synchronized to.

33. A multinode computer system having multiple nodes each with an associated local clock on the node, wherein at least two of the local clocks are to be synchronized with another one of the local clocks from one of the nodes, including a system clock wherein each node is coupled to the system clock without any intermediating nodes and includes at least one processor and a local clock having a dynamic register and a base register, a local clock operating in a first mode of operation wherein the dynamic register of the local clock is incremented in response to the system clock and a second mode of operation wherein a local clock is synchronized by writing a value to the base register of the local clock and resetting the dynamic register of the local clock, the local clock having a local clock value directly determined by adding a value of the base register and a value of the dynamic register, wherein the value of the dynamic register is affected by a signal received from a system-wide synchronize line.

* * * * *